(12) United States Patent
Ohido

(10) Patent No.: US 8,142,676 B2
(45) Date of Patent: Mar. 27, 2012

(54) MAGNETIC GARNET SINGLE CRYSTAL AND OPTICAL ELEMENT USING THE SAME

(75) Inventor: Atsushi Ohido, Tokyo (JP)

(73) Assignee: TDK Corporation, Tokyo (JP)

( * ) Notice: Subject to any disclaimer, the term of this patent is extended or adjusted under 35 U.S.C. 154(b) by 879 days.

(21) Appl. No.: 11/704,192

(22) Filed: Feb. 9, 2007

(65) Prior Publication Data

US 2007/0193504 A1    Aug. 23, 2007

(30) Foreign Application Priority Data

Feb. 20, 2006  (JP) .................................. 2006-042440

(51) Int. Cl.
*G02F 1/09* (2006.01)

(52) U.S. Cl. ................ 252/62.57; 252/62.58; 252/62.59; 117/945

(58) Field of Classification Search ............... 252/62.57, 252/62.58, 62.59; 117/945
See application file for complete search history.

(56) References Cited

U.S. PATENT DOCUMENTS

| | | | | |
|---|---|---|---|---|
| 4,077,832 A | * | 3/1978 | Robertson et al. | 428/822.2 |
| 4,402,787 A | * | 9/1983 | Matsuzawa et al. | 117/7 |
| 4,444,615 A | * | 4/1984 | Matsuzawa et al. | 117/6 |
| 4,519,870 A | * | 5/1985 | Matsuzawa et al. | 117/7 |
| 4,698,820 A | | 10/1987 | Brandle et al. | |
| 4,728,178 A | * | 3/1988 | Gualtieri et al. | 359/282 |
| 5,920,420 A | * | 7/1999 | Ishikura et al. | 359/282 |
| 6,059,878 A | | 5/2000 | Takeda et al. | |
| 6,527,973 B2 | * | 3/2003 | Ohido et al. | 252/62.57 |
| 6,775,052 B2 | * | 8/2004 | Sugawara et al. | 359/324 |
| 6,853,473 B2 | * | 2/2005 | Ohido et al. | 359/280 |
| 6,875,270 B2 | * | 4/2005 | Ohido et al. | 117/54 |
| 7,022,303 B2 | * | 4/2006 | Riman et al. | 423/594.9 |
| 7,133,189 B2 | * | 11/2006 | Ohido et al. | 359/324 |
| 7,187,496 B2 | * | 3/2007 | Sugawara et al. | 359/484 |
| 7,242,516 B2 | * | 7/2007 | Sugawara et al. | 359/324 |
| 7,280,264 B2 | * | 10/2007 | Goto et al. | 359/283 |
| 7,333,261 B2 | * | 2/2008 | Ohido et al. | 359/324 |
| 7,517,406 B2 | * | 4/2009 | Ohido et al. | 117/11 |

(Continued)

FOREIGN PATENT DOCUMENTS

CN          1439749 A          9/2003

(Continued)

OTHER PUBLICATIONS

J. H. Park et al., "Growth of epitaxial garnet film by LPE for application to integrated magneto-optic light switch arrays," Phys. Stat. Sol. (a) Jun. 2004, vol. 201, No. 8, pp. 1976-1979, CODEN: PSSABA; ISSN: 0031-8965.

(Continued)

*Primary Examiner* — Matthew Song
(74) *Attorney, Agent, or Firm* — Oliff & Berridge, PLC

(57) ABSTRACT

The invention relates to a magnetic garnet single crystal and an optical element using the same, for the purpose of providing a magnetic garnet single crystal at a reduced Pb content, and an optical element using the same, where the magnetic garnet single crystal is represented by the chemical formula $Bi_\alpha M1_{3-\alpha} Fe_{5-\beta-\gamma} M2_\beta M3_\gamma O_{12}$ (M1 is at least one element selected from Y, La, Ce, Pr, Nd, Sm, Eu, Gd, Tb, Dy, Ho, Er, Tm, Yb and Lu; and M2 is Si; and M3 is at least one element selected from Zn, Ni, Cu and Mg, provided that $0.5 < \alpha \leq 2.0$, $0 < \beta$, and $0 < \gamma$).

4 Claims, 1 Drawing Sheet

| | Solvents | Magnetic garnet single crystal | | | | | Faraday rotator |
|---|---|---|---|---|---|---|---|
| | | Si amount "β" | M3 | M3 amount "γ" | "β + γ" | crystal defect density (defects/cm²) | optical loss (db) |
| Example 1 | K, Bi, B | 0.004 | Zn | 0.005 | 0.009 | almost zero | 0-0.01 |
| Example 2 | K, Bi, B | 0.019 | Zn | 0.020 | 0.039 | 2 | 0-0.01 |
| Example 3 | K, Bi, B | 0.022 | Zn | 0.023 | 0.045 | 10 | 0-0.01 |
| Example 4 | K, Bi, B | 0.004 | Ni | 0.005 | 0.009 | almost zero | 0-0.01 |
| Example 5 | K, Bi, B | 0.019 | Ni | 0.020 | 0.039 | 2 | 0-0.01 |
| Example 6 | K, Bi, B | 0.022 | Ni | 0.023 | 0.045 | 10 | 0-0.01 |
| Example 7 | K, Bi, B | 0.004 | Cu | 0.005 | 0.009 | almost zero | 0-0.01 |
| Example 8 | K, Bi, B | 0.019 | Cu | 0.020 | 0.039 | 2 | 0-0.01 |
| Example 9 | K, Bi, B | 0.022 | Cu | 0.023 | 0.045 | 10 | 0-0.01 |
| Example 10 | K, Bi, B | 0.004 | Mg | 0.005 | 0.009 | almost zero | 0-0.01 |
| Example 11 | K, Bi, B | 0.019 | Mg | 0.020 | 0.039 | 2 | 0-0.01 |
| Example 12 | K, Bi, B | 0.022 | Mg | 0.023 | 0.045 | 10 | 0-0.01 |
| Comparative Example 1 | Na, Bi, B | - | - | - | - | almost zero | 3.0-3.5 |
| Comparative Example 2 | K, Bi, B | - | - | - | - | almost zero | 0.1 |

U.S. PATENT DOCUMENTS

| | | | | |
|---|---|---|---|---|
| 2003/0211369 | A1* | 11/2003 | Riman et al. | 428/702 |
| 2003/0219261 | A1* | 11/2003 | Ohido et al. | 398/207 |
| 2006/0112873 | A1* | 6/2006 | Uchida et al. | 117/30 |
| 2007/0002425 | A1* | 1/2007 | Goto et al. | 359/280 |
| 2007/0160875 | A1 | 7/2007 | Ohido | |
| 2007/0193504 | A1* | 8/2007 | Ohido | 117/49 |
| 2007/0193506 | A1 | 8/2007 | Ohido | |
| 2008/0095686 | A1 | 4/2008 | Ohido | |
| 2009/0073549 | A1 | 3/2009 | Ohido | |
| 2009/0294682 | A1* | 12/2009 | Perna | 250/370.11 |
| 2009/0294683 | A1* | 12/2009 | Perna | 250/370.11 |

FOREIGN PATENT DOCUMENTS

| | | |
|---|---|---|
| DE | 2 318 798 | 10/1973 |
| EP | 0 208 476 A2 | 1/1987 |
| JP | B2 57-45719 | 9/1982 |
| JP | A-62-143893 | 6/1987 |
| JP | B2 6-46604 | 6/1994 |
| JP | A 09-202697 | 8/1997 |
| JP | A-10-072296 | 3/1998 |
| JP | A 2000-086396 | 3/2000 |
| JP | A 2001-44026 | 2/2001 |
| JP | A 2001-44027 | 2/2001 |
| JP | A-2003-306397 | 10/2003 |
| JP | A 2004-083390 | 3/2004 |
| JP | A 2004-269305 | 9/2004 |
| JP | A 2006-169093 | 6/2006 |
| WO | WO 2005/056887 A1 | 6/2005 |
| WO | WO 2006/054628 A1 | 5/2006 |

OTHER PUBLICATIONS

Office Action for U.S. Appl. No. 11/666,331, mailed Mar. 13, 2009.
Office Action for U.S. Appl. No. 11/666,331, mailed Nov. 17, 2009.
Restriction/Election Requirement for U.S. Appl. No. 11/666,331 mailed Jun. 29, 2009.
European Search Report for Application No. 07001472.5; mailed May 17, 2010.
U.S. Office Action issued Jun. 11, 2010 in U.S. Appl. No. 11/655,070.
Nov. 22, 2010 Search Report issued in European Application No. 05806917.0.
Tolksdorf et al., "The Growth of Bismuth Iron Garnet Layers by Liquid Phase Epitaxy," Thin Solid Films, vol. 14, pp. 33-43, Apr. 13, 1984, XP002608755.
Krüger, et al., "Bismuth, Bismuth Alloys, and Bismuth Compounds," available at http://onlinelibrary.wiley.com/doi/10.1002/14356007.a04_171/full (Published Online: Jan. 15, 2003), XP002608766.
Krüger, et al., "Bismuth, Bismuth Alloys, and Bismuth Compounds," Ullmann's Encyclopedia of Industrial Chemistry, pp. 122, XP008128419.
Telesnin et al., "Anomalous magnetic viscosity in ferritegarnet epitaxial films," Soviet Technical Physics Letters, American Institute of Physics, vol. 7, pp. 431-434, Jan. 1, 1981, XP008128430.
Robertson, J.M., "Improvement of Lead-Free Flux Systems for the Growth of Bismuth-Substituted Iron Garnet Films by Liquid Phase Epitaxy," *Journal of the Electrochemical Society*; vol. 123, No. 8; Aug. 1976; pp. 1248-1249.
Hirano et al., "NaOH Solution HydrothermalGrowth and Superconducting Properties of $BaPb_{1-x}Bi_xO_3$ Single Crystals," Journal of Crystal Growth, vol. 85, pp. 602-606, 1987.
Robertson, J.M., "Improvement of Lead-Free Flux Systems for the Growth of Bismuth-Substituted Iron Garnet Films by Liquid Phase Epitaxy," *Journal of the Electrochemical Society*; vol. 123, No. 8; Aug. 1976; pp. 1248-1249.

* cited by examiner

|  | Solvents | Magnetic garnet single crystal ||||| Faraday rotator |
|  |  | Si amount "β" | M3 | M3 amount "γ" | "β + γ" | crystal defect density (defects/cm²) | optical loss (db) |
| --- | --- | --- | --- | --- | --- | --- | --- |
| Example 1 | K, Bi, B | 0.004 | Zn | 0.005 | 0.009 | almost zero | 0-0.01 |
| Example 2 | K, Bi, B | 0.019 | Zn | 0.020 | 0.039 | 2 | 0-0.01 |
| Example 3 | K, Bi, B | 0.022 | Zn | 0.023 | 0.045 | 10 | 0-0.01 |
| Example 4 | K, Bi, B | 0.004 | Ni | 0.005 | 0.009 | almost zero | 0-0.01 |
| Example 5 | K, Bi, B | 0.019 | Ni | 0.020 | 0.039 | 2 | 0-0.01 |
| Example 6 | K, Bi, B | 0.022 | Ni | 0.023 | 0.045 | 10 | 0-0.01 |
| Example 7 | K, Bi, B | 0.004 | Cu | 0.005 | 0.009 | almost zero | 0-0.01 |
| Example 8 | K, Bi, B | 0.019 | Cu | 0.020 | 0.039 | 2 | 0-0.01 |
| Example 9 | K, Bi, B | 0.022 | Cu | 0.023 | 0.045 | 10 | 0-0.01 |
| Example 10 | K, Bi, B | 0.004 | Mg | 0.005 | 0.009 | almost zero | 0-0.01 |
| Example 11 | K, Bi, B | 0.019 | Mg | 0.020 | 0.039 | 2 | 0-0.01 |
| Example 12 | K, Bi, B | 0.022 | Mg | 0.023 | 0.045 | 10 | 0-0.01 |
| Comparative Example 1 | Na, Bi, B | - | - | - | - | almost zero | 3.0-3.5 |
| Comparative Example 2 | K, Bi, B | - | - | - | - | almost zero | 0.1 |

MAGNETIC GARNET SINGLE CRYSTAL AND OPTICAL ELEMENT USING THE SAME

BACKGROUND OF THE INVENTION

1. Field of the Invention

The present invention relates to a magnetic garnet single crystal and an optical element using the same.

2. Description of the Related Art

Faraday rotator is an optical element with a function to rotate the polarization plane of transmitting light and is used in optical devices such as optical isolator, optical attenuator, optical circulator and photo-magnetic field sensor for communication. Faraday rotator is generally prepared by using a plane-like bismuth (Bi)-substituted rare-earth iron garnet single crystal. The Bi-substituted rare-earth iron garnet single crystal is prepared by the liquid phase epitaxial (LPE) process as one of flux processes.

In growing the Bi-substituted rare-earth iron garnet single crystal by the LPE process, generally, lead oxide (PbO), bismuth oxide ($Bi_2O_3$) and boron oxide ($B_2O_3$) are used as the solvents so as to stably grow such garnet single crystal while the solvents are maintained at their supersaturation states. Therefore, a trace amount of lead (Pb) contaminates in magnetic garnet single crystals during the growth thereof. In Faraday rotators for use in optical devices for communication, magnetic garnet single crystals at a Pb content "y" of about 0.03 to 0.06 in the chemical formula $Bi_{3-x-y}M1_xPb_yFe_{5-z-w}M2_zM3_wO_{12}$ have been used conventionally. See Patent Reference 1: JP-A-2001-044026; Patent Reference 2: JP-A-2001-044027; and Patent Reference 3: JP-B-Hei 6-046604.

Following the upsurge in the recent environmental protection movement, however, efforts are now directed toward the reduction of the content of Pb as an environmental load substance in any of industrial products. Therefore, a trace amount of contaminating Pb in magnetic garnet single crystals grown by the LPE process has drawn concerns as a potential factor of environmental pollution. Accordingly, it is necessary to reduce or eliminate the amount of Pb contained in magnetic garnet single crystals as materials constituting Faraday rotators.

SUMMARY OF THE INVENTION

It is an object of the present invention to provide a magnetic garnet single crystal at a reduced Pb content, and an optical element using the same.

The object is attained with a magnetic garnet single crystal represented by the chemical formula $Bi_\alpha M1_{3-\alpha}Fe_{5-\beta-\gamma}M2_\beta M3_\gamma O_{12}$ (M1 is at least one element selected from Y, La, Ce, Pr, Nd, Sm, Eu, Gd, Tb, Dy, Ho, Er, Tm, Yb and Lu; and M2 is Si; and M3 is at least one element selected from Zn, Ni, Cu and Mg, provided that $0.5 < \alpha \leq 2.0$, $0 < \beta$, and $0 < \gamma$).

The magnetic garnet single crystal in accordance with the invention is characteristic in that the "β" and the "γ" satisfy the relation of $0 < \beta + \gamma \leq 0.04$.

The object is attained with an optical element prepared by using the magnetic garnet single crystal in accordance with the invention.

In accordance with the invention, the Pb content in the magnetic garnet single crystal can be reduced or completely eliminated.

BRIEF DESCRIPTION OF THE DRAWINGS

FIG. 1 shows a table collectively showing the elements contained in the solvents in the following Examples and Comparative Examples in one mode for carrying out the invention, and the Si amount "β", the element as M3, the M3 amount "γ", the amount of "β+γ", and the crystal defect density in the resulting magnetic garnet single crystals therein, and the optical loss of the prepared Faraday rotators.

DESCRIPTION OF THE PREFERRED EMBODIMENTS

A magnetic garnet single crystal and an optical element using the same, in a first mode for carrying out the invention, are now described with reference to FIG. 1. So as to grow a magnetic garnet single crystal with a smaller Pb content, in this mode, Pb contained in a solvent is at least partially replaced with another substance. Compared with other oxides, a great number of substances containing sodium (Na) and oxygen are dissolved at lower temperatures. Therefore, such substances are effective as solvents for growing magnetic garnet single crystals. A magnetic garnet single crystal grown in a solvent containing for example sodium hydroxide (NaOH) is of an excellent quality without any defects or cracks. It was however demonstrated that the garnet single crystal grown in Na-containing solvents had very high optical absorption in a wavelength band region of 1300 to 1600 nm for use in optical communication. When garnet single crystals with such high optical absorption are processed to prepare an optical element such as Faraday rotator, disadvantageously, the optical loss (insertion loss) in the resulting optical element may be elevated.

Herein, one Faraday rotator was prepared by processing a magnetic garnet single crystal $[(BiGdYb)_3Fe_5O_{12}]$ grown in NaOH, $Bi_2O_3$ and $B_2O_3$ as solvents by the LPE process. The optical loss of the Faraday rotator against the beam at a wavelength of 1.55 μm was 3 dB. The other Faraday rotator was prepared by processing a magnetic garnet single crystal $[(BiGdYb)_3Fe_5O_{12}]$ grown in a solvent containing Pb by the LPE process. The optical loss of the Faraday rotator against the beam at a wavelength of 1.55 μm was 0.05 dB or less. It was now shown that the optical loss of the Faraday rotator prepared by using the Na-containing solvent was extremely high compared with the optical loss of the Faraday rotator prepared by using the Pb-containing solvent. The composition of the magnetic garnet single crystal grown in the Na-containing solvent was examined by X-ray fluorescence analysis. Na at about 100 to 300 ppm was detected in the magnetic garnet single crystal. The cation (positive ion) constituting the Bi-substituted rare-earth iron garnet is essentially trivalent. When the Na cation with a stable valence number of monovalence enters in a garnet single crystal, the charge balance is deteriorated so that the resulting garnet single crystal is a semiconductor. This indicates the occurrence of optical absorption in the magnetic garnet single crystal grown in the Na-containing solvent.

In this mode, potassium (K) is used instead of Na. Like Na, K is an effective element as a solvent for growing magnetic garnet single crystals. Additionally because K has a far larger ion radius compared with rare-earth elements and Bi constituting magnetic garnet, K never enters in any magnetic garnet single crystal, unlike Na. Because cations constituting magnetic garnet single crystals are almost totally trivalent, the charge balance is hardly deteriorated. It was nevertheless found that it was very difficult to minimize the optical absorption of even a magnetic garnet single crystal grown by using K as the solvent. The cause may mainly be the deterioration of the charge balance in the resulting magnetic garnet single crystal when oxygen deficiency (oxygen defect), namely partial deficiency of oxygen atoms occurs.

In light of the problem described above in this mode of carrying out the invention, at least one of zinc oxide (ZnO), nickel oxide (NiO), copper oxide (CuO) and magnesium oxide (MgO) was additionally added together with silicone oxide ($SiO_2$) to the blend material, to grow a magnetic garnet single crystal. The grown garnet single crystal was processed into a Faraday rotator to evaluate the optical loss. It was found that the optical loss was likely reduced to a lower value. When two or more of ZnO, NiO, CuO and MgO were added together with $SiO_2$ to the blend material, the optical loss of the resulting Faraday rotator was reduced as well. Zn, Ni, Cu and Mg are stable at their bivalent cationic states in garnet, while Si is stable at its tetravalent cationic state in garnet. These bivalent and tetravalent cations are incorporated in garnet while compensating the charge. By allowing appropriate amounts of the bivalent and tetravalent cations to be contained in a magnetic garnet single crystal, the charge balance inclusive of the influence of the oxygen deficiency can be resumed. Thus, the resulting magnetic garnet single crystal is an insulant. It is suggested that the optical absorption of the magnetic garnet single crystal was reduced in such manner.

Si, Zn, Ni, Cu and Mg are elements to be substituted with Fe. Among them, Zn, Ni, Cu and Mg have such larger ion radii compared with Fe that these may cause the occurrence of crystal defects when a greater amount of these elements enter in a magnetic garnet single crystal. When a large amount of Si enters in a magnetic garnet single crystal, larger amounts of Zn, Ni, Cu and Mg also enter therein so as to balance the charge. So as to suppress the reduction of the productivity of the Faraday rotator due to crystal defects, preferably, the total amount of Si, Zn, Ni, Cu and Mg in substitution is adjusted to 0.04 or less ($0<\beta+\gamma\leqq0.04$).

So as to grow a Bi-substituted rare-earth iron garnet single crystal in a solvent containing K, the supersaturated state of the solution can be retained stably. Accordingly, Bi can stably enter in a garnet single crystal up to about 2.0 in the chemical formula ($\alpha\leqq2.0$). So as to obtain a satisfactory rotation coefficient (deg/μm) as a Faraday rotator, meanwhile, Bi is required in a garnet single crystal at 0.5 or more in the chemical formula ($\alpha\geqq0.5$).

In this mode, furthermore, the following elements capable of stably forming a garnet single crystal singly or in combination with Fe are used as rare-earth elements to be contained in a Bi-substituted rare-earth iron garnet single crystal: yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

As described above, the magnetic garnet single crystal in the mode for carrying out the invention is represented by the chemical formula $Bi_\alpha M1_{3-\alpha}Fe_{5-\beta-\gamma}M2_\beta M3_\gamma O_{12}$ (M1 is at least one element selected from Y, La, Ce, Pr, Nd, Sm, Eu, Gd, Tb, Dy, Ho, Er, Tm, Yb and Lu; M2 is Si; and M3 is at least one element selected from Zn, Ni, Cu and Mg, provided that $0.5<\alpha\leqq2.0$, $0<\beta$, and $0<\gamma$). According to this mode, a magnetic garnet single crystal from which Pb is preliminarily removed almost completely as well as an optical element using the same can be realized. According to this mode for carrying out the invention, still further, the optical absorption of the magnetic garnet single crystal from which Pb is preliminarily removed almost completely and the optical loss of the resulting optical element can be reduced.

The magnetic garnet single crystal and the optical element using the same in accordance with this mode are more specifically described below, using Examples and Comparative Examples.

EXAMPLE 1

$Gd_2O_3$, $Yb_2O_3$, $Fe_2O_3$, $SiO_2$, ZnO, $B_2O_3$, $Bi_2O_3$, and potassium hydroxide (KOH) were charged in a gold (Au) crucible, which was arranged in an electric furnace. By dissolving the materials in the crucible by raising the furnace temperature to 950° C., a melt (solution) was generated and agitated with an agitation device made of Au. As a substrate for growing a magnetic garnet single crystal thereon, a single crystal wafer prepared from an ingot of a garnet single crystal grown by the pulling method is used. In this Example, a CaMgZr-substituted GGG (gadolinium.gallium.garnet) single crystal substrate [$(GdCa)_3(GaMgZr)_5O_{12}$] is used as the substrate for growing the single crystal.

Arranging the CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Zn detected. The composition was examined in detail by the ICP (inductively coupled plasma) analysis, with the contents of Si and Zn determined. Consequently, it was shown that the chemical formula of the magnetic garnet single crystal was $(BiGdYb)_{3.000}Fe_{4.991}Si_{0.004}Zn_{0.005}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with not any crystal defects observed (crystal defect density was almost zero defect/$cm^2$. A non-reflective film was formed on the polished face of the resulting single crystal plate. 20 samples were taken out of the prepared Faraday rotators to evaluate the optical loss against the beam at a wavelength of 1.55 μm. The optical loss of each Faraday rotator was 0 to 0.01 dB, which was very small optical loss.

EXAMPLE 2

$Gd_2O_3$, $Yb_2O_3$, $Fe_2O_3$, $SiO_2$, ZnO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Zn detected. The composition was examined in detail by the ICP analysis, with the contents of Si and Zn determined. Consequently, it was shown that the chemical formula of the magnetic garnet single crystal was $(BiGdYb)_{3.000}Fe_{4.961}Si_{0.019}Zn_{0.020}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with crystal defects observed at about 2 defects/$cm^2$. Because Faraday rotators for use in optical devices are generally in squares of 2 mm or less dimensionally, a crystal defect density approximately at the level or less has no significant influence on the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 3

$Gd_2O_3$, $Yb_2O_3$, $Fe_2O_3$, $SiO_2$, ZnO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Zn detected. The composition was examined in detail by the ICP analysis, with the contents of Si and Zn determined. Consequently, it was shown that the chemical formula of the magnetic garnet single crystal was $(BiGdYb)_{3.000}Fe_{4.955}Si_{0.022}Zn_{0.023}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with crystal defects observed at about 10 defects/cm$^2$. A crystal defect density at such a high level may sometimes reduce the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 4

$Gd_2O_3$, $Yb_2O_3$, $Fe_2O_3$, $SiO_2$, NiO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Ni detected. The composition was examined in detail by the ICP analysis, with the contents of Si and Ni determined. Consequently, it was shown that the chemical formula of the magnetic garnet single crystal was $(BiGdYb)_{3.000}Fe_{4.991}Si_{0.004}Ni_{0.005}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with not any crystal defects observed. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 5

$Gd_2O_3$, $Yb_2O_3$, $Fe_2O_3$, $SiO_2$, NiO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Ni detected. The composition was examined in detail by the ICP analysis, with the contents of Si and Ni determined. Consequently, it was shown that the chemical formula of the magnetic garnet single crystal was $(BiGdYb)_{3.000}Fe_{4.961}Si_{0.019}Ni_{0.020}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with crystal defects observed at about 2 defects/cm$^2$. Because Faraday rotators for use in optical devices are generally in squares of 2 mm or less dimensionally, a crystal defect density approximately at the level or less has no significant influence on the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 6

$Gd_2O_3$, $Yb_2O_3$, $Fe_2O_3$, $SiO_2$, NiO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Ni detected. The composition was examined in detail by the ICP analysis, with the contents of Si and Ni determined. Consequently, it was shown that the chemical formula of the magnetic garnet single crystal was $(BiGdYb)_{3.000}Fe_{4.955}Si_{0.022}Ni_{0.023}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with crystal defects observed at about 10 defect/cm$^2$. A crystal defect density at such a high level may sometimes reduce the productivity of the resulting Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 7

$Gd_2O_3$, $Yb_2O_3$, $Fe_2O_3$, $SiO_2$, CuO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Cu detected. The composition was examined in detail by the ICP analysis, with the contents of Si and Cu determined. Consequently, it was shown that the chemical formula of the magnetic garnet single crystal was $(BiGdYb)_{3.000}Fe_{4.991}Si_{0.004}Cu_{0.005}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with not any crystal defects observed. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 8

$Gd_2O_3$, $Yb_2O_3$, $Fe_2O_3$, $SiO_2$, CuO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Cu detected. The composition was examined in detail by the ICP analysis, with the contents of Si and Cu determined. Consequently, it was shown that the chemical formula of the magnetic garnet single crystal was $(BiGdYb)_{3.000}Fe_{4.961}Si_{0.019}Cu_{0.020}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with crystal defects observed at about 2 defects/cm$^2$. Because Faraday rotators for use in optical devices are generally in squares of 2 mm or less dimensionally, a crystal defect density approximately at the level or less has no significant influence on the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 9

$Gd_2O_3$, $Yb_2O_3$, $Fe_2O_3$, $SiO_2$, CuO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Cu detected. The composition was examined in detail by the ICP analysis, with the contents of Si and Cu determined. Consequently, it was shown that the chemical formula of the magnetic garnet single crystal was $(BiGdYb)_{3.000}Fe_{4.955}Si_{0.022}Cu_{0.023}O_{12}$. By processing the grown single crystal film, a single crystal plate with a rotation angle of 45 deg toward the beam at a wavelength of 1.55 µm was prepared. The inside of the single crystal plate was observed with an infrared polarization microscope, with crystal defects observed at about 10 defects/cm$^2$. A crystal defect density at such a high level may sometimes reduce the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 µm. The optical loss of each Faraday rotator was 0 to 0.01 dB, which was very small optical loss.

EXAMPLE 10

$Gd_2O_3$, $Yb_2O_3$, $Fe_2O_3$, $SiO_2$, MgO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 µm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Mg detected. The composition was examined in detail by the ICP analysis, with the contents of Si and Mg determined. Consequently, it was shown that the chemical formula of the magnetic garnet single crystal was $(BiGdYb)_{3.000}$ $Fe_{4.991}Si_{0.004}Mg_{0.005}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with not any crystal defects observed. A non-reflective film was formed on the polished face of the resulting single crystal plate to prepare Faraday rotators. 20 samples were taken out of the prepared Faraday rotators to evaluate the optical loss against the beam at a wavelength of 1.55 μm. The optical loss of each Faraday rotator was 0 to 0.01 dB, which was very small optical loss.

EXAMPLE 11

$Gd_2O_3$, $Yb_2O_3$, $Fe_2O_3$, $SiO_2$, MgO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Mg detected. The composition was examined in detail by the ICP analysis, with the contents of Si and Mg determined. Consequently, it was shown that the chemical formula of the magnetic garnet single crystal was $(BiGdYb)_{3.000}Fe_{4.961}Si_{0.019}Mg_{0.020}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with crystal defects observed at about 2 defects/cm². Because Faraday rotators for use in optical devices are generally in squares of 2 mm or less dimensionally, a crystal defect density approximately at the level or less has no significant influence on the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 μm. The optical loss of each Faraday rotator was 0 to 0.01 dB, which was very small optical loss.

EXAMPLE 12

$Gd_2O_3$, $Yb_2O_3$, $Fe_2O_3$, $SiO_2$, MgO, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with no Si or Mg detected. The composition was examined in detail by the ICP analysis, with the contents of Si and Mg determined. Consequently, it was shown that the chemical formula of the magnetic garnet single crystal was $(BiGdYb)_{3.000}Fe_{4.955}Si_{0.022}Mg_{0.023}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with crystal defects observed at about 10 defects/cm². A crystal defect density at such a high level may sometimes reduce the productivity of Faraday rotator. A non-reflective film was formed on the polished face of the resulting single crystal plate to prepare Faraday rotators. 20 samples were taken out of the prepared Faraday rotators to evaluate the optical loss against the beam at a wavelength of 1.55 μm. The optical loss of each Faraday rotator was 0 to 0.01 dB, which was very small optical loss.

COMPARATIVE EXAMPLE 1

$Gd_2O_3$, $Yb_2O_3$, $Fe_2O_3$, $B_2O_3$, $Bi_2O_3$, and NaOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.300}Gd_{1.200}Yb_{0.500}Fe_{5.000}O_{12}$, with no Na detected. The composition was examined in detail by the ICP analysis, with the Na content determined. Consequently, it was shown that the chemical formula of the magnetic garnet single crystal was $(BiGdYb)_{2.998}Na_{0.002}Fe_{5.000}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with not any crystal defects observed. A non-reflective film was formed on the polished face of the resulting single crystal plate to prepare Faraday rotators. 20 samples were taken out of the prepared Faraday rotators to evaluate the optical loss against the beam at a wavelength of 1.55 μm. The optical loss of each Faraday rotator was 3.0 to 3.5 dB, which was very high optical loss.

COMPARATIVE EXAMPLE 2

$Gd_2O_3$, $Yb_2O_3$, $Fe_2O_3$, $B_2O_3$, $Bi_2O_3$, and KOH were charged in an Au crucible, which was arranged in an electric furnace. By dissolving the materials in the crucible by raising the furnace temperature to 950° C., a melt was generated and agitated with an agitation device made of Au. Arranging a CaMgZr-substituted GGG substrate onto a fixing device made of Au and then charging the substrate into a furnace, the furnace temperature was lowered down to 850° C. and then, a single face of the substrate was put in contact with the melt to allow epitaxial growth for 40 hours. A magnetic garnet single crystal film of a film thickness of 500 μm was obtained. The grown single crystal film was compositionally analyzed by X-ray fluorescence analysis. The composition was $Bi_{1.300}Gd_{1.200}Yb_{0.500}Fe_{5.000}O_{12}$. By processing the grown single crystal film, a single crystal plate with a rotation angle of 45 deg toward the beam at a wavelength of 1.55 μm was prepared. The inside of the single crystal plate was observed with an infrared polarization microscope, with not any crystal defects observed. A non-reflective film was formed on the polished face of the resulting single crystal plate to prepare Faraday rotators. 20 samples were taken out of the prepared Faraday rotators to evaluate the optical loss against the beam at a wavelength of 1.55 μm. The optical loss of each Faraday rotator was about 0.1 dB.

FIG. 1 collectively depicts the elements contained in the solvents in the above Examples and Comparative Examples, the Si amount "$\beta$", the element as M3, the M3 amount "$\gamma$", the amount of $\beta+\gamma$, and the crystal defect density (defects/cm$^2$) in the grown magnetic garnet single crystals therein, and the optical loss (dB) of the prepared Faraday rotators therein. As shown in FIG. 1, the magnetic garnet single crystals in Examples 1 through 12 were grown in K-containing solvents and contained M2 (Si) and M3 (at least one of Zn, Ni, Cu and Mg) ($\beta>0$, $\gamma>0$). Meanwhile, the magnetic garnet single crystal in Comparative Example 1 was grown in a solvent containing not K but Na. Furthermore, the magnetic garnet single crystals in the Comparative Examples 1 and 2 never contained M2 and M3. Furthermore, Pb was never detected in the magnetic garnet single crystals in Examples 1 through 12 and Comparative Examples 1 and 2.

In addition to almost complete removal of Pb in the Faraday rotators using the magnetic garnet single crystals in Examples 1 through 12, the Faraday rotators were at smaller optical loss compared with the Faraday rotators using the magnetic garnet single crystals in Comparative Examples 1 and 2. In case that the M2 amount "$\beta$" and the M3 amount "$\gamma$" satisfy the relation of the formula $0<\beta+\gamma\leq0.04$ (Examples 1, 2, 4, 5, 7, 8, 10 and 11), the crystal defect densities in the magnetic garnet single crystals are so small that the productivity of Faraday rotator is elevated.

What is claimed is:

1. A magnetic garnet single crystal represented by the chemical formula $Bi_\alpha M1_{3-\alpha}Fe_{5-\beta-\gamma}M2_\beta M3_\gamma O_{12}$, wherein M1 is at least one element selected from Y, La, Ce, Pr, Nd, Sm, Eu, Gd, Tb, Dy, Ho, Er, Tm, Yb and Lu;

M2 is Si;

M3 is at least one element selected from Zn, Ni, and Cu;

$0.5<\alpha\leq2.0$;

$0<\beta$;

and $0<\gamma$.

2. A magnetic garnet single crystal according to claim 1, where the "$\beta$" and the "$\gamma$" satisfy the relation of $0<\beta+\gamma\leq0.04$.

3. An optical element comprising the magnetic garnet single crystal according to claim 1.

4. An optical element comprising the magnetic garnet single crystal according to claim 2.

* * * * *